United States Patent [19]
Hshieh et al.

[11] Patent Number: 5,986,304
[45] Date of Patent: Nov. 16, 1999

[54] PUNCH-THROUGH PREVENTION IN TRENCHED DMOS WITH POLY-SILICON LAYER COVERING TRENCH CORNERS

[75] Inventors: Fwu-Iuan Hshieh, Saratoga; Koon Chong So, San Jose; True-Lon Lin, Cupertino, all of Calif.

[73] Assignee: MegaMOS Corporation, San Jose, Calif.

[21] Appl. No.: 08/782,368

[22] Filed: Jan. 13, 1997

[51] Int. Cl.$^6$ .................................................. H01L 29/76
[52] U.S. Cl. ........................ 257/330; 257/328; 257/332; 257/329; 257/361; 257/362; 257/497; 257/498; 257/499
[58] Field of Search ........................ 257/328, 330–332, 257/334, 347, 356, 203–223, 228, 472, 476; 438/203, 100, 225, 228, 361–362, 497, 498, 499

[56] References Cited

U.S. PATENT DOCUMENTS 5,032,529  7/1991  Beitman et al. ........................ 438/212
5,623,152  4/1997  Majumdar et al. ..................... 257/330
5,693,569  12/1997  Ueno ..................................... 438/270

*Primary Examiner*—Fetsum Abraham
*Attorney, Agent, or Firm*—Bo-In Lin

[57] ABSTRACT

The present invention includes a substrate of a first conductivity type having a top surface including at least two intersecting trenches disposed therein with an insulating layer lining the trenches and a conductive material filling the trenches. The transistor also includes a source region of the first conductivity type extending from the top surface of the substrate adjacent to the trenches toward the substrate. The transistor further has a body region of a second conductivity type of opposite polarity from the first conductivity type, the body region extends from the top surface adjacent from the trenches to the substrate and surrounding the source region. The conductive material filling the trenches including punch-through suppressing blocks covering corners of the cell defined by the intersecting trenches wherein the source region disposed underneath the corners immediately next to the trenches having a lower net concentration of impurities of the first conductivity type than remaining portion of the source region.

9 Claims, 11 Drawing Sheets

PUNCH-THROUGH PREVENTION IN TRENCHED DMOS WITH POLY-SILICON LAYER COVERING TRENCH CORNERS

BACKGROUND OF THE INVENTION

1. Field of the Invention

This invention relates generally to the structure and fabrication process of trenched power DOMS transistors. More particularly, this invention relates to a novel and improved structure and process for fabricating a trenched power DMOS transistor provided with punch through prevention by applying a polysilicon layer to cover the trench corners to reduce the source dopant concentration in the corners where the trenches intersect.

2. Description of the Prior Art

The design and manufacture of a conventional trenched DMOS transistor are often limited by several technical difficulties. Specifically, the side wall damages caused by trench etching processes may affect the side wall oxide thickness and adversely affect the transistor performance. As a result of the weak points in the side wall oxide layer, particular design concerns arise which is related to a the punch through phenomena. A non-destructive leakage current in the channel region is induced due to the punch through. This problem more typically occurs at the sharp corners where two trenches intersect due to the difficulties in forming a uniform oxide layer on those spots and also the uneven diffusion process caused by the special geometric shapes at the corners.

A type of MOSFET transistor which applies double diffusion to form the active device regions is a DMOS transistor. It is also well known in the art to form trenches which is lined with thin layer of oxide and filled with conductive polysilicon to act as gate of the transistors. These types of transistors are often applied as power devices. In order to better understand the technical background of the present invention, the general device structure of a trenched DMOS transistor is first described. FIG. 1 is a cross-sectional view of a typical DMOS cell 10 in the core cell region which is supported on a N+ substrate 15 and an N-epi-taxial layer 20 formed on its top. The cell 10 includes a deep p-body region 25, a source region 30 wherein the source region 30 and the p-body region 25 surround a trenched gate 40 insulated by a gate oxide layer 35. The DMOS cell 10 is then covered with a PSG or BPSG protection layer 45 and connected externally with a gate contact 55, a source and body contact 50 and a drain contact 60. This device structure with the gate formed in a trench has the advantage that the cell density can be increased by shrinking the poly-gate length without the limitation, as that encountered in a planar DMOS, that the JFET resistance is increased when the gate poly length is reduced. The trenched DMOS transistors also have the additional benefits that the on-resistance is reduced as the result of higher cell density.

In U.S. Pat. No. 5,468,982 entitled "Trenched DMOS Transistor with Channel Block at Cell Trench Corners" (issued on Nov. 21, 1995), Hshieh et al., disclose a trenched DMOS transistor which applies a blocking photo-resist on the principle surface of the substrate to cover the areas where two trenches intersect during the source region implant. The corners where the trenches intersect are then blocked from forming channels therein. By blocking the corners at trench intersections, a cutout structure is generated at each trench corner such that the source regions do not extend to the trench corner. Instead the underlying body regions which are doped with opposite conductivity type extend to the trench corners. The problem of punch-through which is especially a problem with trenched DMOS transistors may be prevented. Puch-through which typically occurs at the channel region in the form of a leakage current prior to avalanche breakdown, tends to occur at the sharper corners, e.g., corners where two trenches intersect due to the crowding of the electric field lines with the corner curvature. With the cell structure as disclosed in the patented invention, the punch-through problems at the corners of trench intersections are eliminated.

For DMOS transistors of higher density, there is a disadvantage using the cell structure according to Hshieh et al. Referring to FIGS. 2A and 2B for the patented DMOS and the configuration of the blocking masks applied for carrying out the source implant operation. The small rectangular areas 142a, 142b, 142c, and 142a-1, are applied to block the center of each cell and blocks 142a-1, 142a-2, 142b-1, 142b-2, 142c-1, and 142c-2, etc., are applied to block the corners of the trench intersections. The length of the blocks 142a-1, i.e., d, is 3.5 micros, and the width of the blocks 142a-1 to 142c-2, i.e., e, is 1.7 microns. As the size of the cell shrinks, higher proportion of the trench areas, i.e., the areas 124a, 124b, . . . , and 124h, are now covered by the photo-resist areas used as source blocking. As more of the trenched poly gates are covered by the photo-resists for source blocking, the dopant concentration in the trenched poly is reduced as the doping ions are blocked in these covered areas. Reduction in dopant concentration in the trenched poly causes the conductive area to reduce. Thus, the sheet resistances in the trenched polycrystalline silicon are increased due to the reduced conductive areas in the trenched poly-gates. The speed of the device is adversary affected due to the higher poly sheet resistance.

Therefore, there is still a need in the art of power device fabrication, particularly for trenched power transistor design and fabrication, to provide a structure and fabrication process that would resolve these limitations.

SUMMARY OF THE PRESENT INVENTION

It is therefore an object of the present invention to provide an improved trenched DMOS structure and fabrication process to remove the punch-through weak points at the corners of trench intersections without unduly causing the sheet resistance to increase due to the reduction of the trench areas whereby the aforementioned difficulties encountered in the prior art may be overcome.

Specifically, it is an object of the present invention to provide an improved trenched DMOS structure and fabrication process wherein the punch-through weak points in the trench intersections are removed by reducing the source dopant concentration in the trench corner without unduly increasing the sheet resistance by applying a part of the poly-gates as punch-through blocks covering the trench corners during a source implant process.

Another object of the present invention is to provide an improved trenched DMOS structure and fabrication process wherein the punch-through weak points in the trench intersections are removed by reducing the source dopant concentration in the trench corner without separating the source regions apart from the trench gates by applying a part of the poly-gates as punch-through blocks covering the trench corners during a source implant process whereby the drain-to-source resistance $R_{ds}$ is reduced.

Another object of the present invention is to provide an improved trenched DMOS structure and fabrication process wherein the punch-through weak points in the trench intersections are removed by reducing the source dopant concentration in the trench corner by applying a part of the poly-gates as punch-through blocks covering the trench corners during a source implant process whereby the manufacture processes can be carried out without requiring additional masks or more processing steps.

Briefly, in a preferred embodiment, the present invention includes a substrate of a first conductivity type having a top surface including at least two intersecting trenches disposed therein with an insulating layer lining the trenches and a conductive material filling the trenches. The transistor also includes a source region of the first conductivity type extending from the top surface of the substrate adjacent to the trenches toward the substrate. The transistor further has a body region of a second conductivity type of opposite polarity from the first conductivity type, the body region extends from the top surface adjacent from the trenches to the substrate and surrounding the source region. The conductive material filling the trenches including punch-through suppressing blocks covering corners of the cell defined by the intersecting trenches wherein the source region disposed underneath the corners immediately next to the trenches having a lower net concentration of impurities of the first conductivity type than remaining portion of the source region.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1:
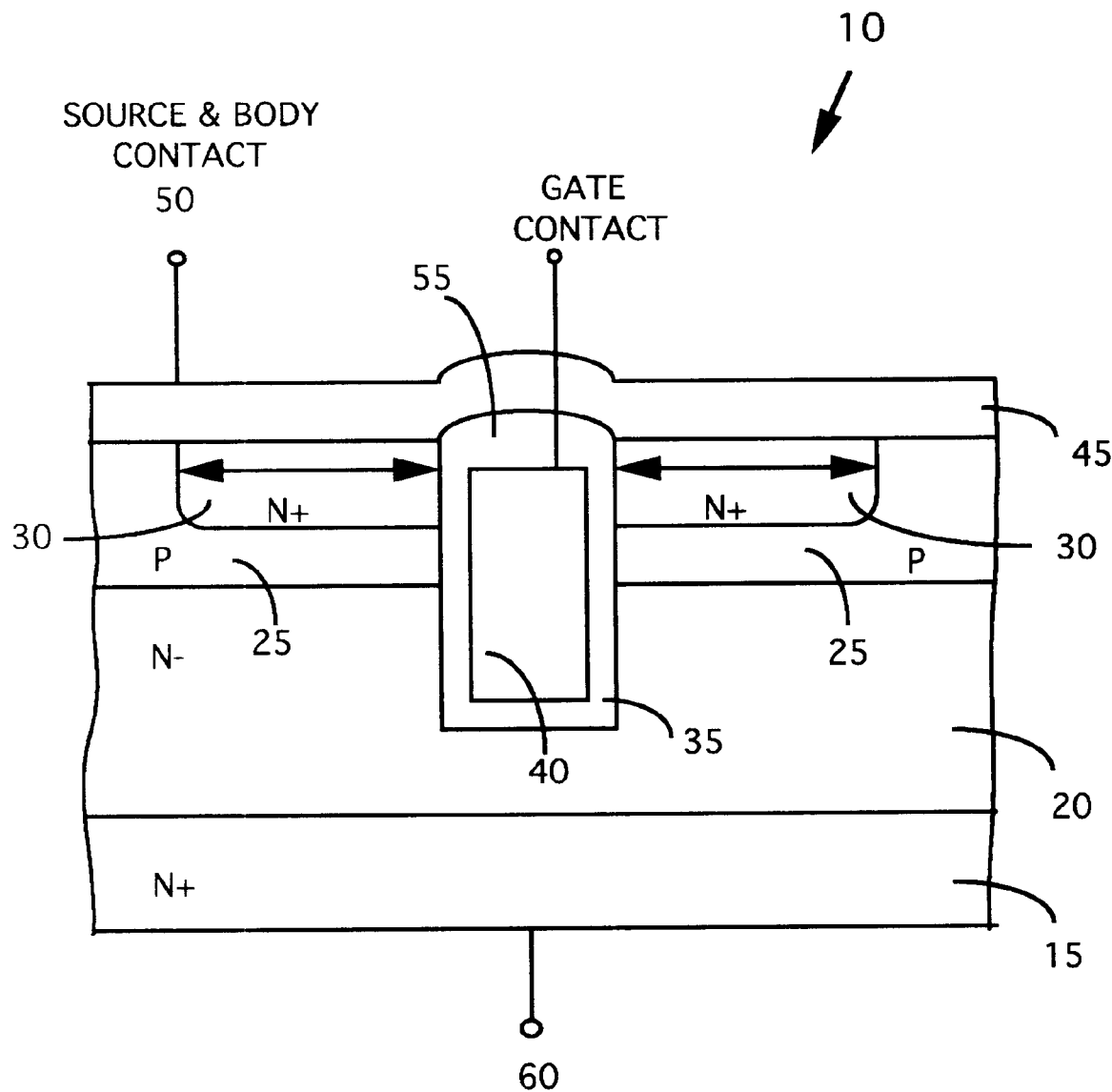
FIG. 1 is a cross-sectional view of a prior art structure of a general trench DMOS transistor.
Figure 2A:
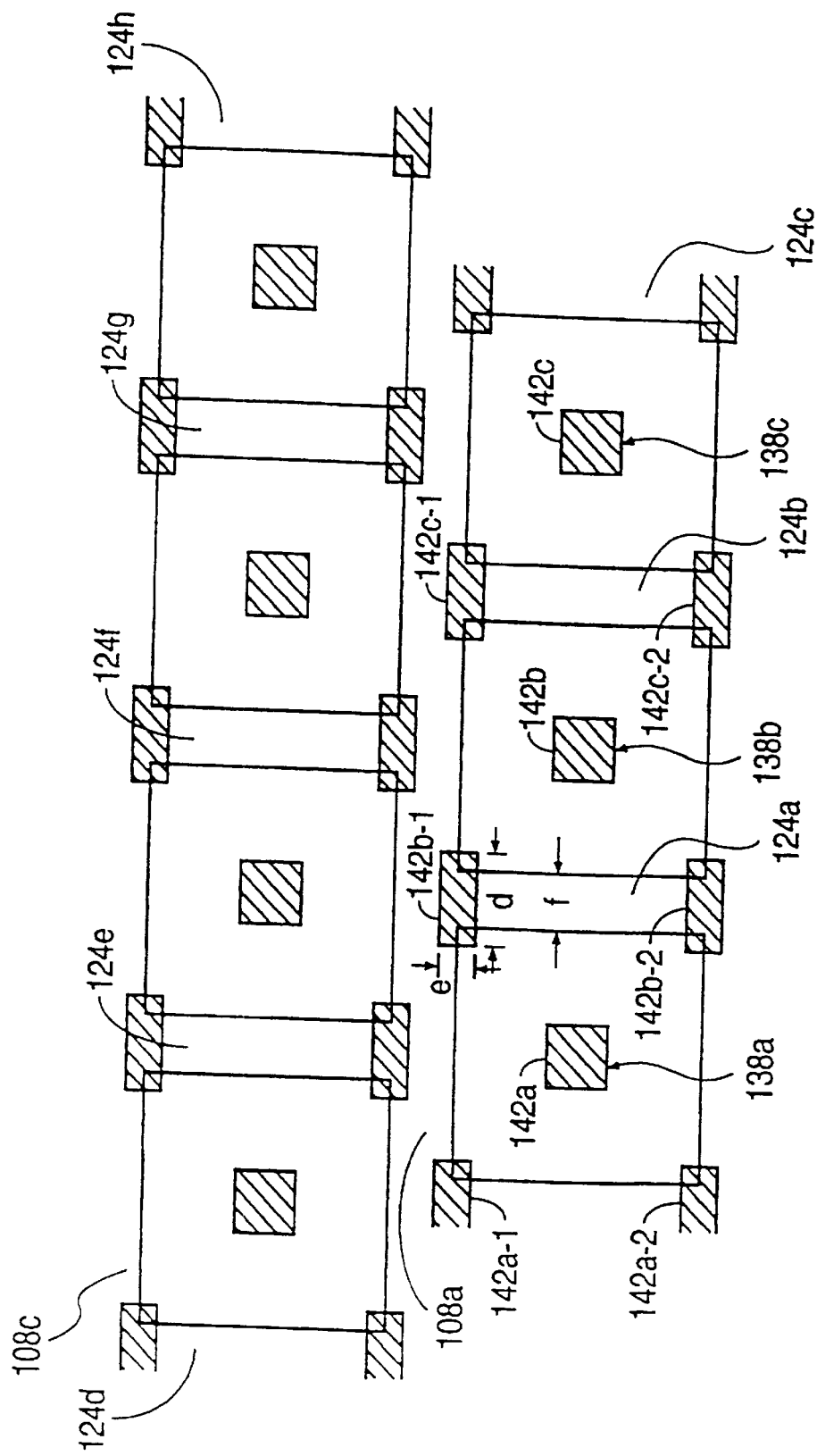
FIGS. 2A and 2B are a partial perspective view and a top view respectively of the trench DMOS cells of a prior art including a plurality of photo resists covering the corners where trenches intersect to separate the source region from the gate for preventing punch through in the gate oxide near the corner of the trenches.
Figure 2B:
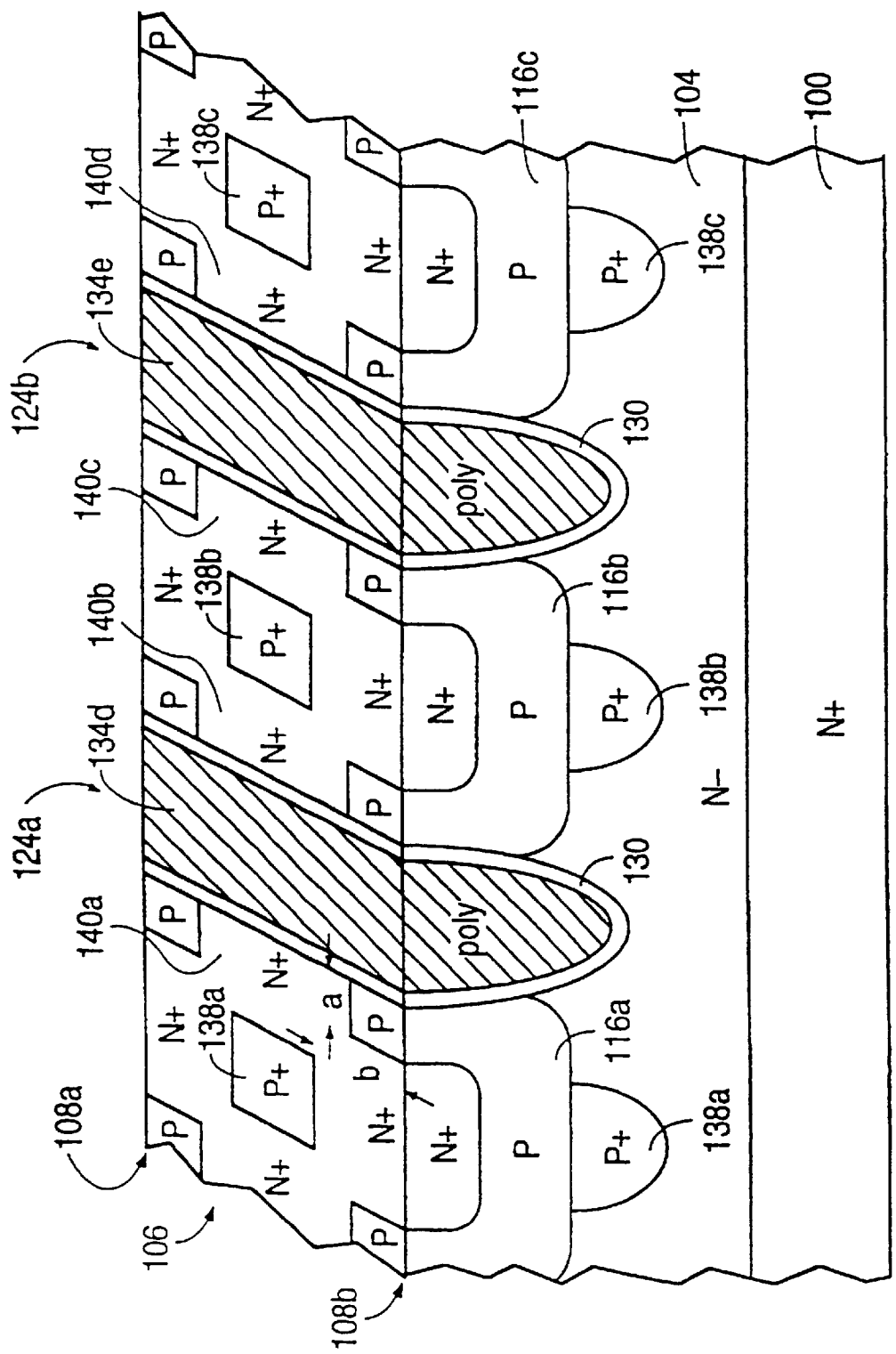
Figure 3A:
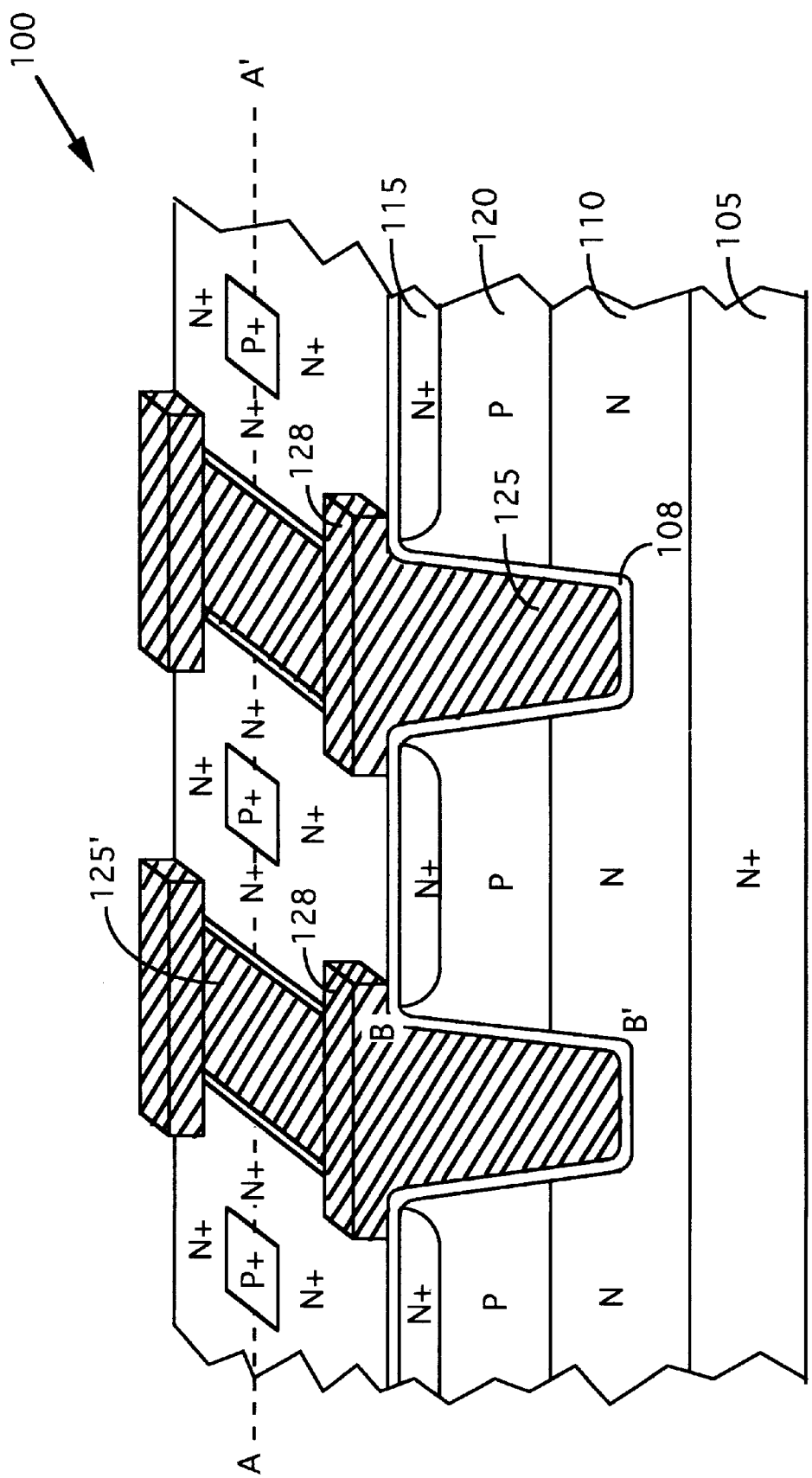
FIGS. 3A is a partial perspective view of a novel trench DMOS transistor including a plurality punch-through prevention blocks formed by applying the poly-gate as implant blocks for reducing the source dopant concentration near the corners where the trench intersect manufactured according to a fabrication method of the present invention.

FIG. 3A shows a partial perspective view of a novel structure for a preferred embodiment which is a DMOS transistor 100 of the present invention. The DMOS transistor 100 is formed on a N+ substrate 105 supporting a N epi-layer 110 thereon. The DMOS transistor 100 includes a plurality of cells in the core cell area each having a vertical pn-junction region with a N+ source region 115 formed on top of a deeper p-body region 120. The DMOS transistor 100 further includes a gate 125 formed with polysilicon layer deposited in a trench formed in the epi-layer 110. An insulating layer 108 lining the trenches 125'. A current path is established from the source 115 via a channel formed in the p-body 120 along the gate 125 and extend to the drain in the N+ substrate 105. For the purpose of preventing the punch through at the corners where the trenches 125' intersect, the poly-gates 125 are formed with special corner-blocking configuration. As shown in FIG. 3A, the poly-gates 125 are formed to rise above the trenches 125' where they intersect to cover four corners thus forming punch-through prevention blocks 128.

Figure 3B:
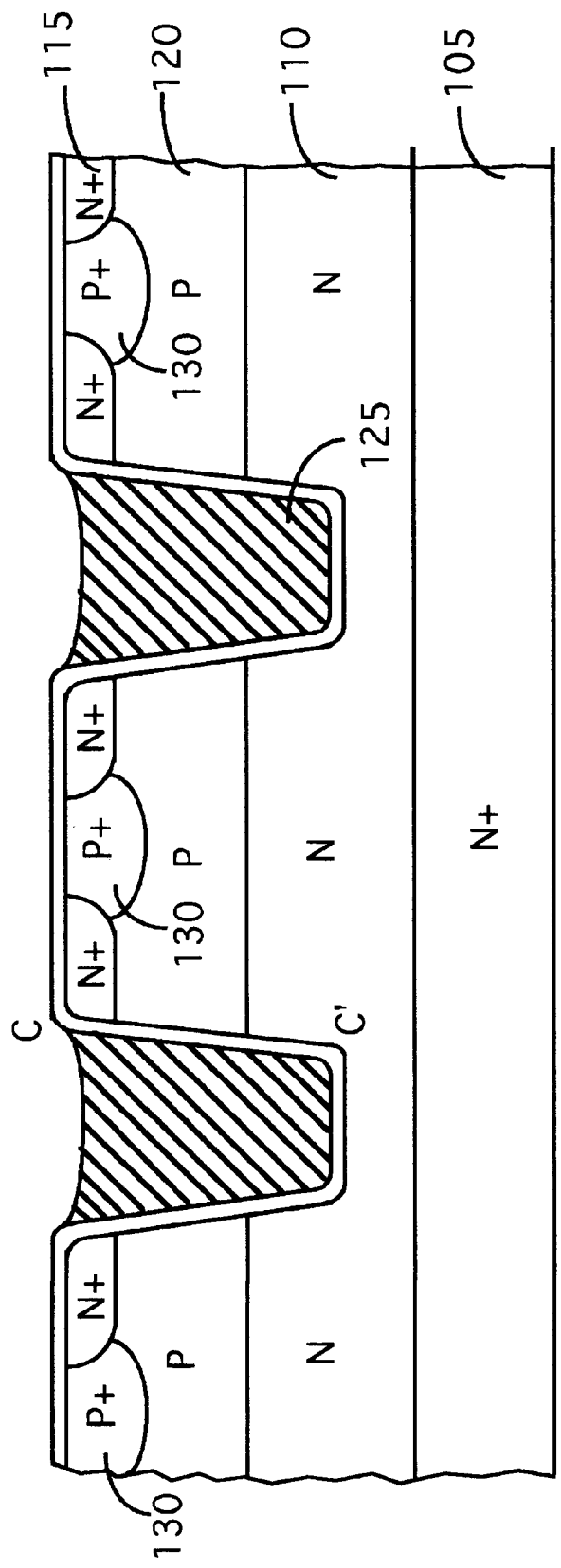
FIG. 3B is a cross section view of a DMOS away from the corners where the trenches intersect.
Figure 3C:
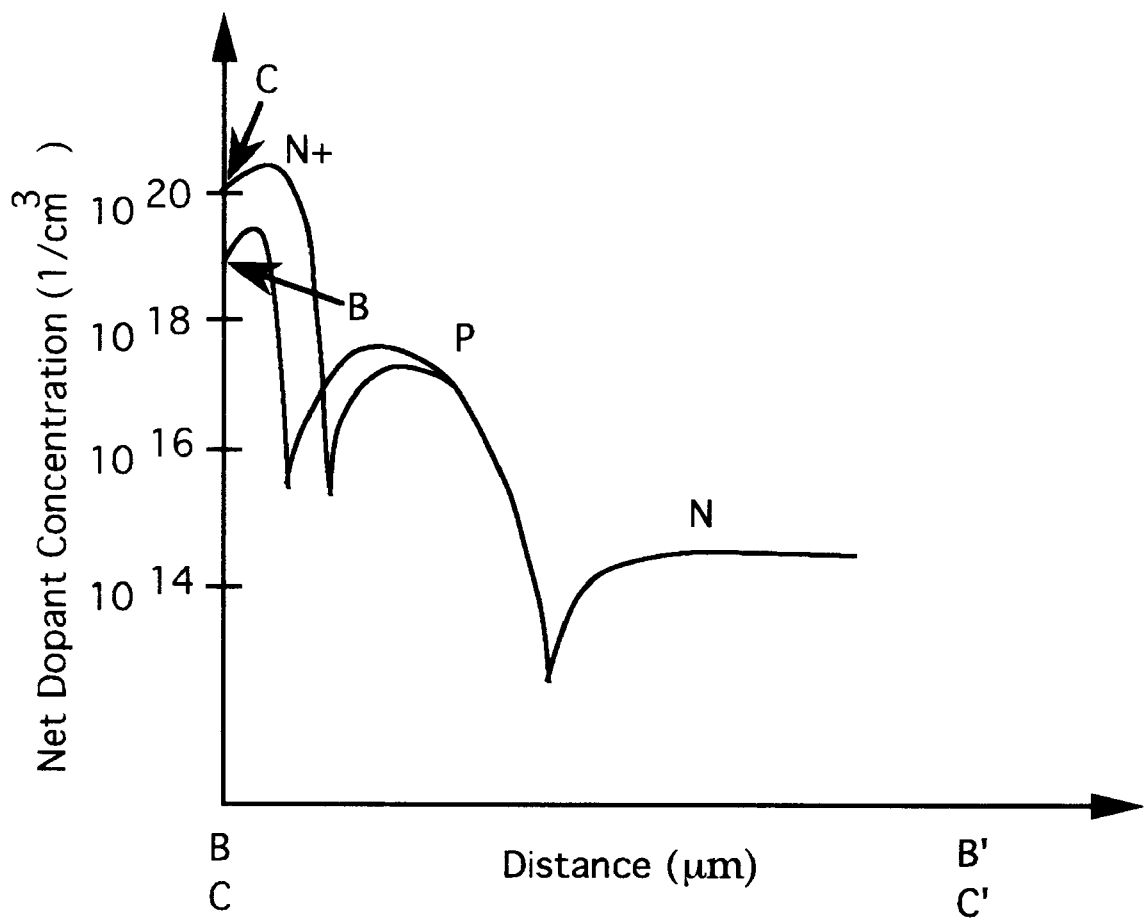
FIG. 3C depicts the variation of net dopant concentrations along a vertical line crosses over the source region, the p-body region, the breakdown suppressing region, the epi-layer and the bottom layer in the substrate.

Special advantages are provided by the punch-through prevention blocks covering the four corners at the intersections of the trenches 125' which can be explained by referring to FIGS. 3B and 3C in combination with FIG. 3A. FIG. 3B shows a cross section view along the line A-A' which is away from the locations of trench intersections. The cross section is just like a conventional trenched DMOS transistor which also includes a p+ region 130 formed between the source regions 115 to provide a connection for external contact of the p-body 120 of the power DMOS transistor. FIG. 3C compares the net dopant concentration profiles along the B-B' cut-through the trench intersections around the punch-through prevention blocks 128 and along the line C-C' which is away from the trench intersections. As shown in FIG. 3C, the variations of the net dopant concentrations along the depth of the transistor from the source regions 115 (N+) to the p-body 120 (P) and then reaches the epi-layer 110 (N), the N+dopant concentration near the corners of the trench intersections, i.e., point B, is lower, e.g., $10^{19}$ versus $10^{20}$ which is by about one-degree of magnitude, than the point C in the source regions 115 which is away from the trench corners. In lowering the dopant concentration by the use of the punch-through prevention blocks 128 in the trench corners which leads to a higher net P dopant concentration right below the source region at the trench corners. A higher peak net body dopant concentration is achieved because the blocks 128 prevent the source dopant ions to enter into the body regions near the corner of the trench intersections (please refer to the curve connected to point B verse that connected to point C for the p-body region). The punch-through weak points near the trench corners are removed because the higher p-dopant concentration prevent a total channel depletion in the body region near the gate-source interface when a reverse bias is applied. The punch-through near the corners of trench intersections is therefore suppressed. This dopant concentration profile is accomplished by the use of a portion of the gate, i.e., the punch-through prevention blocks 128, as a source implant block. No additional mask or processing steps are required to form this novel dopant concentration profile.

The structure of this DMOS transistor as disclosed in this invention provides several advantages. The trench areas are not adversely affected, therefore the difficulties of increased sheet resistance due to the covering up of trench areas by photo resist as that experienced by the prior art is resolved. This is particularly important for DMOS power device when the cell size is reduced. Additional advantage is provided by this novel configuration because the drain-to-source resistance $R_{ds}$ is reduced when there is no separation between the trench-gate 125 and the source regions 115. The depth along the line B-B' and C-C' as shown along the X-axis horizontally has a measurement unit of microns ($\mu$m). As a typical example, the depth of the source regions 115 is about 0.5 μm, the p-body is about 1.25 μm, the depth of the trench is less than 1.5 μm, and the thickness of the epi-layer 110 is about 4 to 7 μm. The weak points of punch through which typically occur at the corner spots near the trench intersections can therefore be removed.

In summary, in a preferred embodiment of this invention it includes transistor cell. The transistor cell includes a substrate of a first conductivity type 105 having a top surface including at least two intersecting trenches 125' disposed therein with an insulating layer 108 lining the trenches 125' and a conductive material filling the trenches. The transistor also includes a source region 115 of the first conductivity type extending from the top surface of the substrate adjacent to the trenches toward the substrate 105. The transistor further has a body region 120 of a second conductivity type of opposite polarity from the first conductivity type, the body region 120 extends from the top surface adjacent from the trenches 125' to the substrate 105 and surrounding the source region 115. The conductive material filling the trenches including punch-through suppressing blocks 128 covering corners of the cell defined by the intersecting trenches wherein the source region 115 disposed underneath the corners immediately next to the trenches 125' having a lower net concentration of impurities of the first conductivity type than remaining portion of the source region. In a preferred embodiment, each of the punch-through suppressing blocks 128 having a length and a width ranging approximately from 0.1 to 0.5 microns. In another preferred embodiment, the cell includes four corners each defined by two of the intersecting trenches 125' and covered by the punch-through suppressing blocks 128. In another preferred embodiment, the body region 120 adjacent to the source region 115 underneath the punch-through suppressing blocks 128 having a higher rate of net-second-conductivity-impurity-concentration increase along a depth direction extending downwardly from the top surface than a remaining portion of the body region 120 whereby a punch-through is suppressed in the trench near the corner. In yet another preferred embodiment, a contact-means body-region 130 of the second conductivity type disposed at a center portion of the source region 115 and extending from the top surface to the substrate for providing a body contact means therein. In yet another preferred embodiment, the source region 115 extending to the top surface and defining a rectangle thereon in contact with the trenches with the corners defined by intersections of trenches overlaid by the punch-through suppressing blocks 128. In another preferred embodiment, the transistor cell further includes a plurality of similar cells arranged in rows and including a gate finger 126 connecting the conductive material filling the trenches in each of the rows. In another preferred embodiment, additional punch-through suppressing blocks 128 covering corners defined by the gate finger 126 intersecting the trenches 125' defining the row of cells.

Figure 4A:
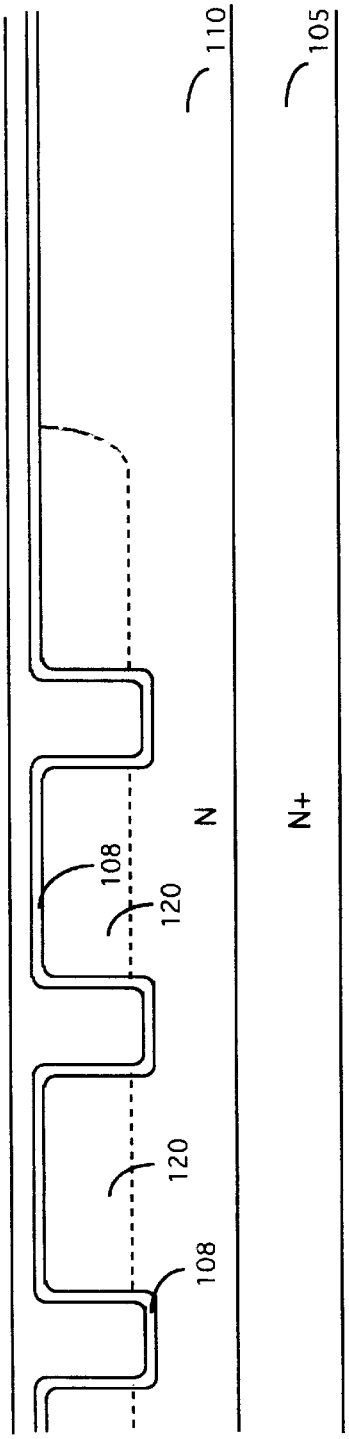
FIGS. 4A to 4F show the processing steps for manufacturing a trench DMOS transistor according to the present invention wherein a plurality of punch-through prevention zones near the corners where the trench intersect are formed without reducing the trench areas.

Please refer to FIGS. 4A to 4H for the processing steps for manufacturing the power MOSFET device 100 described above. As shown in FIG. 4A, the processing steps begins by first growing a N epitaxial layer 110 with a resistivity ranging from 0.1 to 1.0 ohm-cm on top of a N+ substrate 105. The substrate has a resistivity of 0.001 to 0.007 ohm-cm. The thickness and the resistivity of the epitaxial layer 110 depend on the device requirements for the on-resistance and breakdown voltage. In a preferred embodiment, the thickness of the epi-layer 110 is about three to twenty microns (3–20 μm). A p-body mask is then applied to perform a p-body implant with boron ions at 30–100 Kev with an ion beam of $2\times10^{13}$ to $2\times10^{14}/cm^2$ flux density to form the p-body region 120. The p-body mask is then stripped. A p-body diffusion process is then carried out at an elevated temperature of 1,000–1,200° C. for ten minutes to three hours to increase the depth of the p-body region 120 to 1.0–2.0μ. A photo resist is employed as a trench mask. A trench etch process, which is a dry anisotropic etch process, is applied to form trenches ranging from 1.0 to 2.0 micron in depth. A sacrification oxidation process is applied which can be either a dry or wet oxidation process conducted at a temperature of 900–1100° C. to form oxide layer of approximately 300–2000 Å in thickness which is followed by a scarification oxide etch process. A gate oxide layer 108 is then formed by a gate oxidation process which can be a wet or dry oxidation process carried out at a temperature of 800 to 1100° C. to form a layer of thickness in the range of 200 to 1,000 Å. A poly deposition process is performed to deposit a poly layer 125 ranging from 1.5 to 3.0μin thickness. A planarization etch is performed to form a planar surface by etching a top layer to 0.2–0.5μfrom the deposited poly. A $POCL_3$ doping process is carried out at 950° C. to make the poly layer 125 have a sheet resistance of 20–40 $ohm/cm^2$.

Figure 4B:
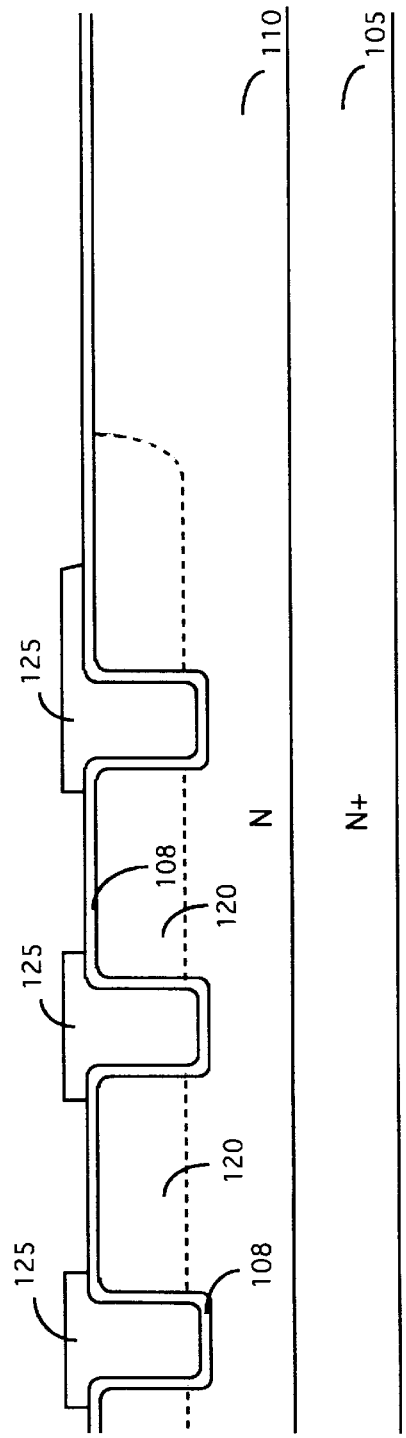
Figure 4C:
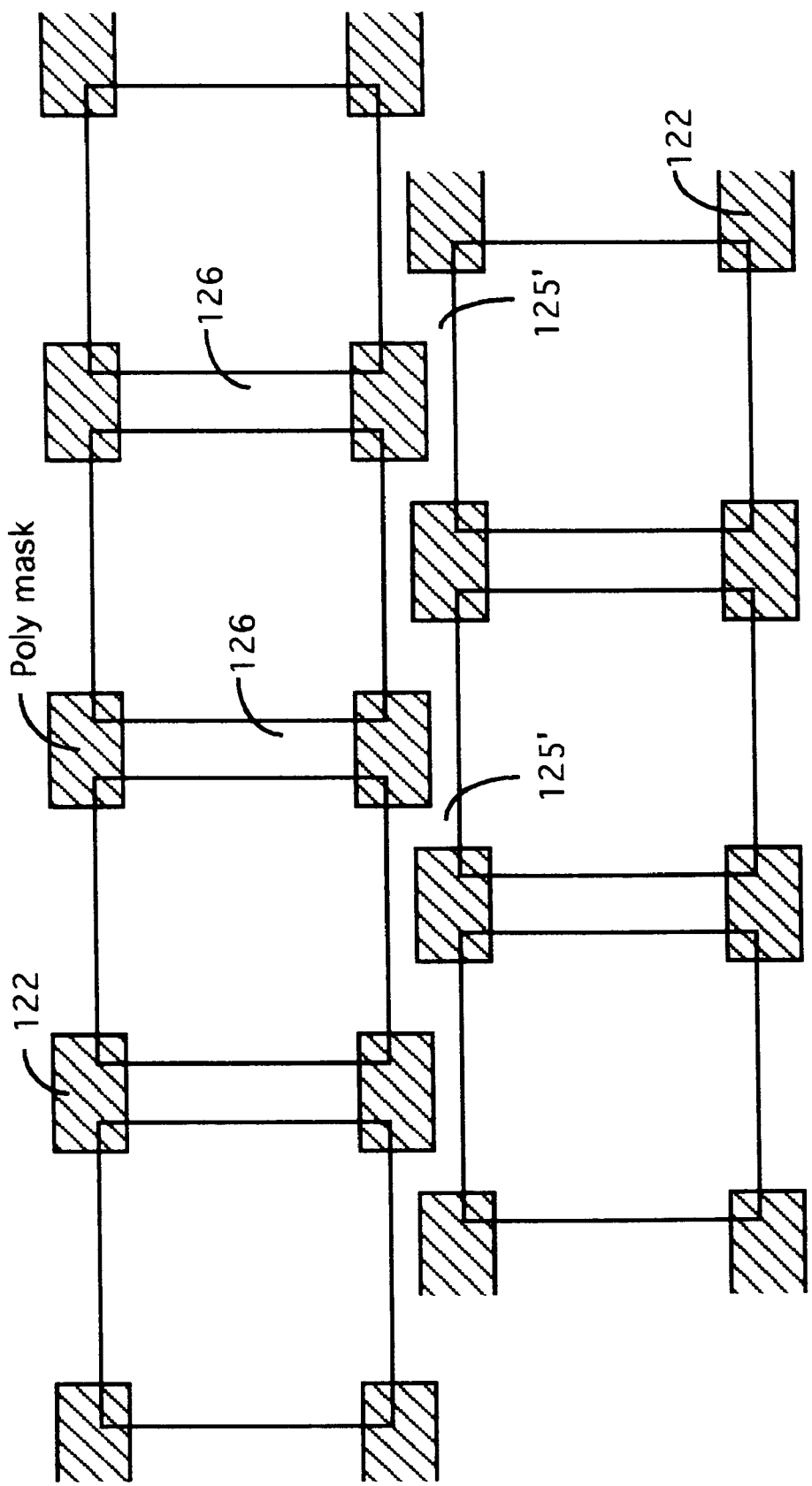

Referring to FIGS. 4B and 4C, where a poly etch is carried out to dry etch the poly layer 125 till the top surface is removed. In FIG. 4C, a specially configured poly mask is applied which includes trench corner covers 122 to cover the corners where the trenches intersect. The polysilicon layer above the trench is removed except where the portion 125' covered by the trench corner covers 122 and the corners at the intersection of the poly-fingers 126 and the trenches 125'. The portion of the poly-gate 125' covered under the cover 122 remains as the punchthrough prevention blocks 128 to serve as implant block to form special regions in the source regions 115 which has less source dopant concentration as that shown in FIG. 3C.

Figure 4D:
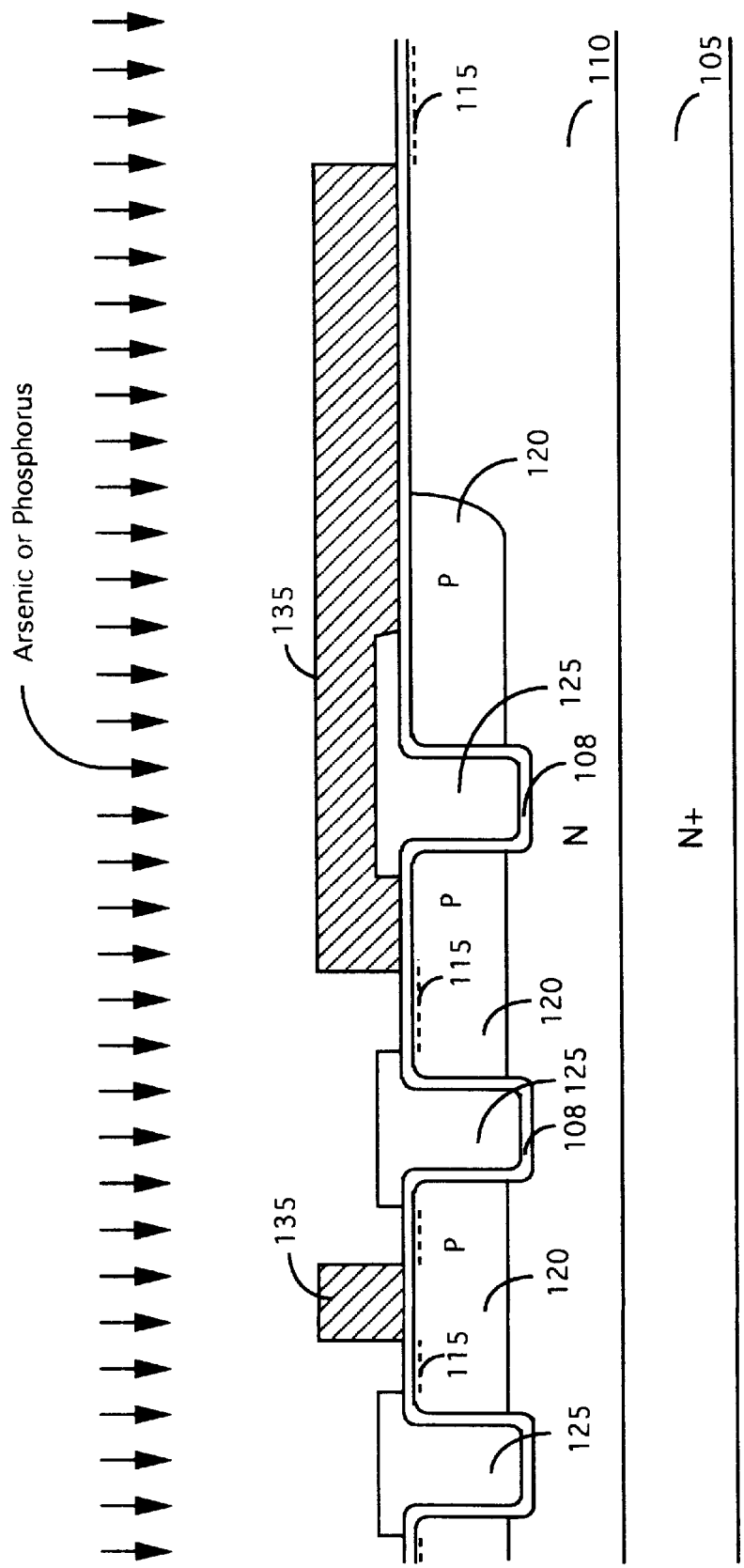
Figure 4E:
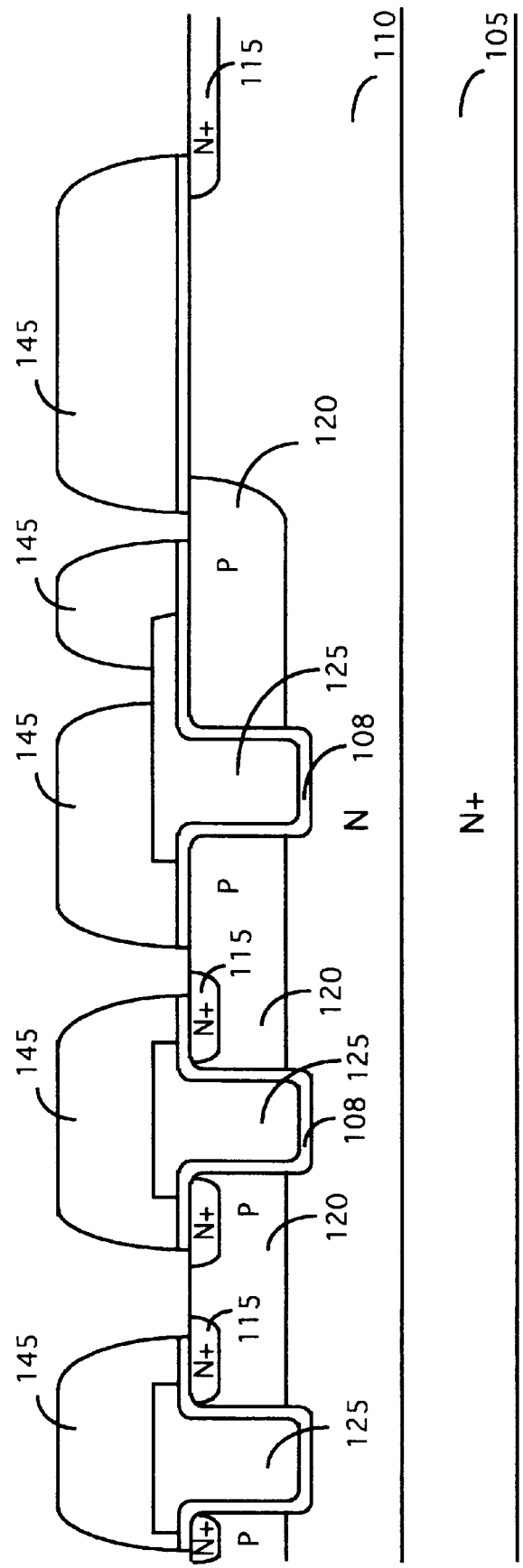
Figure 4F:
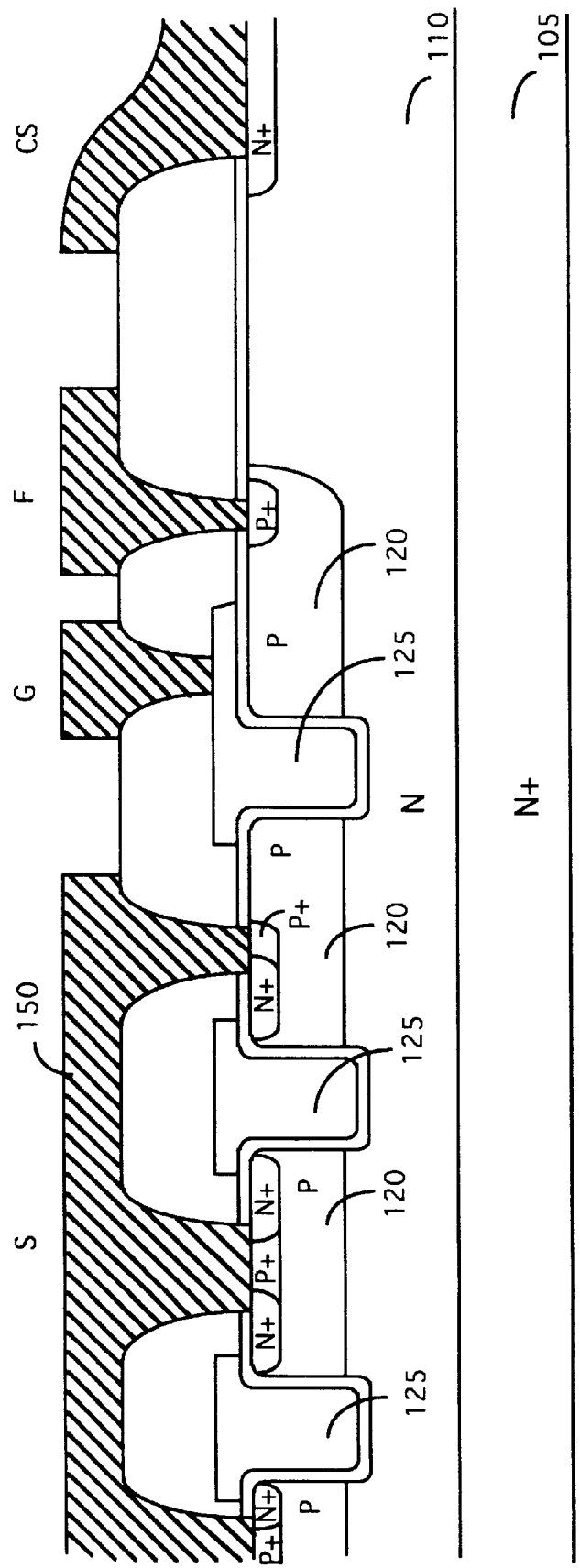

Referring to FIG. 4D, a N+ block mask 135 is applied to carry out an N+ implant to form the N+ region 115. The N+implantation is carried out with an arsenic or phosphorus ion beam at an energy of 40–100 Kev and ion flux density of $5\times10^{15}$ to $1\times10^{16}/cm^2$ then the resist, i.e., the $N^+$ blocking mask 135, is stripped. Referring to FIG. 4E, the $N^+$ source regions 115 are driven into desired junction depth ranging from 0.2 to 1.0μ by a diffusion process at a temperature of 900–1000° C. for 10 minutes to two hours. A BPSG or PSG is deposited to form a layer 145 of approximately 5000–15,000 Å in thickness. A BPSG flow or PSG densification process is performed at 900–950° C. for thirty minutes to one hour. A contact mask is applied to perform a dry etch process to define the contacts windows in order to be ready for making source and gate contacts. A blank boron implant with an ion beam of 20–50 Kev and ion flux of $10^{15}$ to $1\times10^{16}/cm^2$ is carried out to form a $P^+$ contact region 130. Referring to FIG. 4F, a metal deposition process is carried out to form an overlaying metal layer. The final DMOS transistor 100 is completed by applying a metal mask to pattern the source contact 150, the gate contact (G), the field plate (FP) and the channel stop (CS). In carrying out the source implant process shown in FIG. 4D, the source regions 115 near the corners where the trench 125' intersect has less dopant concentration because there is a poly gate cover 125' over the top A method for fabricating a transistor cell is also disclosed in this invention. The method includes the steps of (a) providing a semiconductor substrate 105 with a first region of a first conductivity type extending from a top surface of the substrate; (b) forming a body region 120 in the substrate of a second conductivity type, the body region 120 extending into the substrate from the top surface alongside the trenches; (c) forming at least two trenches 125' in the substrate extending into the substrate from the top surface, the two trenches intersect and defining a cell corner, i.e., point B; (d) forming an insulating layer 108 lining the trenches; (e) forming a conductive electrode 125 in the trenches by filling the trenches with a conductive material overlying the insulating layer and covering the cell corner as a punch-through suppressing blocks 128; and (f) forming a source region 115 of a first conductivity type extending into the substrate from the top surface alongside the trenches, wherein a portion of the source region 115 covered under the punch-through suppressing blocks 128 having a lower net dopant concentration of the first conductivity type than an adjacent portion in the source region whereby a punch-through in the corner is suppressed. In a preferred embodiment, the step (d) of forming a conductive electrode 125 in the trenches and covering the cell corner as the punch-through suppressing blocks is a step forming the punch-through suppressing blocks having a length and a width ranging approximately from 0.1 to 0.5 microns. In another preferred embodiment, the step of forming the source region 115 of a first conductivity type is a step of controlling an ion implant process with ions of first conductivity type for inducing a portion of the body region 120 adjacent to the source region underneath the punch-through suppressing blocks having a higher rate of net-second-conductivity-impurity-concentration increase along a depth direction extending downwardly, i.e., line B-B', from the top surface than a remaining portion of the body region 120 whereby a punch-through is suppressed in the trench near the corner. In another preferred embodiment, the method further includes a step of forming a contact-means body-region 130 of the second conductivity type at a center portion of the source region 115 and extending from the top surface to the substrate for providing a body contact means therein.

Therefore, the present invention provides an improved trenched DMOS structure, and fabrication process to overcome the difficulties of the punch through at the corner of trench intersections without unduly causing the sheet resistance to increase by reducing the trench areas as encountered in the prior art. Specifically, an improved trenched DMOS structure and fabrication process are disclosed wherein the punch-through weak points in the trench intersections are removed by reducing the source dopant concentration in the trench corner without unduly increasing the sheet resistance by applying a part of the poly-gates as punch-through blocks covering the trench corners during a source implant process. The punch-through weak points in the trench intersections are removed without separating the source regions apart from the trench gates by applying a part of the poly-gates as punch-through blocks covering the trench corners during a source implant process whereby the drain-to-source resistance $R_{ds}$ is reduced. By applying a part of the poly-gates as punch-through blocks covering the trench corners during a source implant process, the improved structure is accomplished without requiring additional masks or more processing steps.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A transistor cell comprising:

a substrate of a first conductivity type having a top surface including at least two intersecting trenches disposed therein;

an insulating layer lining said trenches;

a conductive material filling said trenches;

a source region of said first conductivity type extending from said top surface of said substrate adjacent to said trenches toward said substrate;

a body region of a second conductivity type of opposite polarity from said first conductivity type, said body region extends from said top surface adjacent from said trenches to said substrate and surrounding said source region; and said conductive material filling said trenches and partially rising above said trenches only near corners defined by said intersecting trenches for covering said corners thus constituting trench-corner source implant blocking blocks for reducing a net dopant concentration of said source region underneath said blocking blocks immediately next to said corner defined by said intersecting trenches having a lower net concentration of impurities of said first conductivity type than remaining portion of said source region.

2. The transistor cell of claim 1 wherein:

each of said trench-corner source implant blocking blocks rising partially above said trenches near said corners having a length and a width ranging approximately from 0.1 to 0.5 microns for covering an area only surrounding said corners.

3. The transistor cell of claim 1 wherein:

said cell includes four corners each defined by two of said intersecting trenches and covered by said trench-corner source implant blocking blocks rising partially above said trenches near said four corners.

4. A transistor cell comprising:

a substrate of a first conductivity type having a top surface including at least two intersecting trenches disposed therein;

an insulating layer lining said trenches;

a conductive material filling said trenches;

a source region of said first conductivity type extending from said top surface of said substrate adjacent to said trenches toward said substrate;

a body region of a second conductivity type of opposite polarity from said first conductivity type, said body region extends from said top surface adjacent from said trenches to said substrate and surrounding said source region;

said conductive material filling said trenches and partially rising above said trenches only near corners defined by said intersecting trenches for covering said corners thus constituting trench-corner source implant blocking blocks for reducing a net dopant concentration of said source region underneath said blocking blocks immediately next to said corner defined by said intersecting trenches having a lower net concentration of impurities of said first conductivity type than remaining portion of said source region; and said body region adjacent to said source region underneath said trench-corner source implant blocking blocks having a higher rate of net-second-conductivity-impurity-concentration increase along a depth direction extending downwardly from said top surface than a remaining portion of said body region whereby a punch-through is suppressed in said trench near said corner.

5. The transistor cell of claim 1 further comprising:

a contact-means for contacting body-region of said second conductivity type disposed at a center portion of said source region having a higher dopant concentration of said second conductivity type and extending from said top surface to said body region in said substrate for providing a body contact means therein.

6. The transistor cell of claim 1 wherein:

said source region extending to said top surface and defining a rectangle thereon in contact with said trenches with said corners defined by intersections of trenches overlaid by said trench-corner source implant blocking blocks partially rising above said trenches near said corners.

7. The transistor cell of claim 1 further comprising:

a plurality of similar cells arranged in rows and including a trench separating two neighboring rows thus constituting a gate finger connecting said conductive material filling said trenches in each of said rows functioning as a trenched gate for each of said cells.

8. The transistor cell of claim 7 further comprising:

additional trench-corner source implant blocking blocks partially rising above said trenches only near said corners for covering said corners defined by said gate finger intersecting said trenches defining said row of cells.

9. A transistor cell comprising:

a substrate of a first conductivity type having a top surface including at least two intersecting trenches disposed therein;

an insulating layer lining said trenches;

a conductive material filling said trenches;

a source region of said first conductivity type extending from said top surface of said substrate adjacent to said trenches toward said substrate;

a body region of a second conductivity type of opposite polarity from said first conductivity type, said body region extends from said top surface adjacent from said trenches to said substrate and surrounding said source region;

said conductive material filling said trenches and partially rising above said trenches only near corners defined by said intersecting trenches for covering said corners thus constituting trench-corner source implant blocking blocks for reducing a net dopant concentration of said source region underneath said blocking blocks immediately next to said corner defined by said intersecting trenches having a lower net concentration of impurities of said first conductivity type than remaining portion of said source region;

said body region adjacent to said source region underneath said trench-corner source implant blocking blocks having a higher rate of net-second-conductivity-impurity-concentration increase along a depth direction extending downwardly from said top surface than a remaining portion of said body region whereby a punch-through is suppressed in said trench near said corner.

* * * * *